US011839165B2

(12) United States Patent
Hathaway et al.

(10) Patent No.: US 11,839,165 B2
(45) Date of Patent: Dec. 5, 2023

(54) COOLER DEVICE WITH ALUMINUM OXIDE INSULATORS

(71) Applicants: Aaron Ashley Hathaway, Baltimore, MD (US); John X. Przybysz, Severna Park, MD (US); Robert Miles Young, Ellicott City, MD (US); Edward R. Engbrecht, Odenton, MD (US)

(72) Inventors: Aaron Ashley Hathaway, Baltimore, MD (US); John X. Przybysz, Severna Park, MD (US); Robert Miles Young, Ellicott City, MD (US); Edward R. Engbrecht, Odenton, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 18/163,203

(22) Filed: Feb. 1, 2023

(65) Prior Publication Data
US 2023/0180634 A1 Jun. 8, 2023

Related U.S. Application Data

(62) Division of application No. 16/696,372, filed on Nov. 26, 2019, now Pat. No. 11,600,760.

(51) Int. Cl.
*H10N 60/82* (2023.01)
*F25B 21/02* (2006.01)
(Continued)

(52) U.S. Cl.
CPC ............ *H10N 60/82* (2023.02); *F25B 21/02* (2013.01); *H10N 60/0912* (2023.02); *H10N 60/805* (2023.02)

(58) Field of Classification Search
CPC ..... H01L 39/02; H01L 39/2493; H01L 39/06; F25B 21/00; F25B 21/02
See application file for complete search history.

(56) References Cited

U.S. PATENT DOCUMENTS

| | | | |
|---|---|---|---|
| 4,837,604 A * | 6/1989 | Faris | H03K 19/1956 327/528 |
| 6,581,387 B1 * | 6/2003 | Ullom | H10N 60/10 62/3.1 |

(Continued)

FOREIGN PATENT DOCUMENTS

| | | | |
|---|---|---|---|
| EP | 2192629 A1 * | 6/2010 | H01L 39/02 |
| JP | H1041558 A | 2/1998 | |
| WO | 2017115008 A1 | 7/2017 | |

OTHER PUBLICATIONS

Lee et al. (Two-Dimensional Material Tunnel Barrier for Josephson Junctions and Superconducting Qubits); Published Oct. 29, 2019; DOI: 10.1021/acs.nanolett.9b03886; Nano Lett. 2019, 19, 8287-8293 (Year: 2019).*

(Continued)

*Primary Examiner* — Gordon A Jones
(74) *Attorney, Agent, or Firm* — Tarolli, Sundheim, Covell & Tummino L.L.P.

(57) ABSTRACT

A solid state cooler device is disclosed that comprises a first normal metal pad, a first aluminum layer and a second aluminum layer disposed on the first normal metal pad and separated from one another by a gap, a first aluminum oxide layer formed on the first aluminum layer, and a second aluminum oxide layer formed on the second aluminum layer, and a first superconductor pad disposed on the first aluminum oxide layer and a second superconductor pad disposed on the second aluminum oxide layer. The device further comprises a first conductive pad coupled to the first superconductor pad, and a second conductive pad coupled to (Continued)

the second superconductor pad, wherein hot electrons are removed from the first normal metal pad when a bias voltage is applied between the first conductive pad and the second conductive pad.

9 Claims, 7 Drawing Sheets

(51) Int. Cl.
*H10N 60/80* (2023.01)
*H10N 60/01* (2023.01)

(56) References Cited

U.S. PATENT DOCUMENTS

| | | | |
|---|---|---|---|
| 8,301,214 | B1 | 10/2012 | Tolpygo et al. |
| 2006/0216815 | A1* | 9/2006 | Cheng ............... B01L 7/525 422/50 |
| 2011/0259018 | A1* | 10/2011 | Lee ................... F25B 21/02 62/3.2 |
| 2020/0335549 | A1* | 10/2020 | Sandberg ........... H10N 69/00 |
| 2021/0063060 | A1 | 3/2021 | Young et al. |
| 2021/0066571 | A1 | 3/2021 | Hathaway et al. |

OTHER PUBLICATIONS

Pekola, et al.: "NIS chip refrigeration." Cryogenics 39.8 (1999): 653-657. Found on the internet Mar. 29, 2023 at: https://www.sciencedirect.com/science/article/abs/pii/S0011227599000648.

Office Action dated Mar. 14, 2023 for corresponding JP 2022-525121.

Camarasa-Gomez, et al: "Superconducting cascade electron refrigerator", Applied Physics Letters, A I P Publishing LLC, US, vol. 104, No. 19, May 12, 2014 (May 12, 2014), XP012185456, ISSN: 0003-6951, DOI: 10.1063/1.4876478 [retrieved on Jan. 1, 1901] the whole document.

Clark, et al: "Practical electron-tunneling refrigerator", Applied Physics Letters, A I P Publishing LLC, US, vol. 84, No. 4, Jan. 26, 2004 (Jan. 26, 2004), pp. 625-627, XP012061945, ISSN: 0003-6951, DOI: 10.1063/1.1644326 figure 1.

Courtois, et al: "High-performance electronic cooling with superconducting tunnel junctions", Comptes Rendus—Physique., vol. 17, No. 10, Dec. 1, 2016 (Dec. 1, 2016), pp. 1139-1145, XP055738239, FR ISSN: 1631-0705, DOI: 10.1016/j.crhy.2016.08.010 p. 1141, line 31-p. 1144, line 4; figure 2(d).

Agulo, et al: "Effective electron microrefrigeration by superconductor-insulator-normal metal tunnel junctions with advanced geometry of electrodes and normal metal traps; Effective electron microrefrigeration by SIN tunnel junctions with advanced geometry of electrodes and normal metal traps", Nanotechnology, Institute of Physics Publishing, GB, vol. 15, No. 4, Apr. 1, 2004 (Apr. 1, 2004), pp. S224-S228, XP020067898, ISSN: 0957-4484, DOI: 10.1088/0957-4484/15/4/020 figures 1,2.

Muhonen, et al: "Micrometer-scale refrigerators," arXiv: 1203.5100v1 [cond-mat.mes-hall] Mar. 22, 2012.

Leoni, et al: "Electron cooling by arrays of submicron tunnel junction", Journal of Applied Physics, vol. 85, p. 3877-3881, (1999)—XP012047026.

Nguyen, et al: "A cascade electronic refrigerator using superconducting tunnel junctions", arxiv.org, Cornell University Library, 201 Olin Library Cornell University Ithaca, NY 14853, May 3, 2016 (May 3, 2016), XP080699075, figure 1.

Prest, et al: "Strain enhanced electron cooling in a degenerately doped semiconductor", Applied Physics Letters, A I P Publishing LLC, US, vol. 99, No. 25, Dec. 19, 2011 (Dec. 19, 2011), pp. 251908-251908, XP012152781, ISSN: 0003-6951, DOI: 10.1063/1.3670330 [retrieved on Dec. 22, 2011].

Quaranta, et al., "Cooling electrons from 1 K to 400 mK with V-based nanorefrigerators", arXiv:1011.0588v1 [cond-mat.mes-hall], p. 1-4, (2010)—XP080460092.

Nguyen, et al (2): "A robust platform cooled by superconducting electronic refrigerators", Appl. Phys. Lett. Appl. Phys. Lett, Jan. 1, 2015 (Jan. 1, 2015), pp. 12601-12601, XP055738241, Retrieved from the Internet: URL:https://aip.scitation.org/doi/pdf/10.1063/1.4905440 p. 1, right-hand col. line 8-p. 2, right-hand col. line 29; figure 1.

Nguyen, et al. (3): "Trapping hot quasi-particles in a high-power superconducting electronic cooler<" 2013 New J. Phys. 15 085013.

* cited by examiner

US 11,839,165 B2

COOLER DEVICE WITH ALUMINUM OXIDE INSULATORS

RELATED APPLICATIONS

This application claims priority from U.S. patent application Ser. No. 16/696,372, filed 26 Nov. 2019, which is incorporated herein in its entirety.

TECHNICAL FIELD

The present invention relates generally to refrigeration, and more particularly to a cooler device with aluminum oxide insulators.

BACKGROUND

Solid-state electron cooling by the tunneling of "hot" electrons across a normal metal-insulator-superconductor (NIS) junction, using a bias voltage, has been proven to work below 1K, substantially operating like the more familiar near room-temperature Peltier thermo-electric refrigerator. These NIS cryo-coolers are built from the same materials as Josephson junctions used in the superconducting circuitry and by the same lithography fabrication foundry tools, and are fundamentally completely compatible with the Josephson junction components. They could be integrated alongside the Josephson junctions themselves, fabricated concurrently. However, currently NIS coolers have a very limited temperature throw, with a maximum temperature difference between hot and cold sides of ~150 mK.

One of the main limitations to NIS coolers' full performance is the presence in the superconducting leads of non-equilibrium quasi-particles arising from the high current running through the device. The low quasi-particle relaxation rate and thermal conductivity in a superconductor bind these hot particles in the vicinity of the junction and lead to severe overheating in the superconducting electrodes. There are several methods for reducing the accumulation of quasi-particles in a superconductor. The most common method is to use a normal metal coupled to the superconductor referred to as a quasiparticle trap, such that quasi-particles migrate to the normal metal and relax their energy there through electron-electron and electron-phonon interaction. This device is referred to as a normal metal-insulator-superconductor-normal metal (NISN) junction.

SUMMARY

In one example, a solid state cooler device is disclosed that comprises a first normal metal pad, a first aluminum layer and a second aluminum layer disposed on the first normal metal pad and separated from one another by a gap, a first aluminum oxide layer formed on the first aluminum layer, and a second aluminum oxide layer formed on the second aluminum layer, and a first superconductor pad disposed on the first aluminum oxide layer and a second superconductor pad disposed on the second aluminum oxide layer. The device further comprises a first conductive pad coupled to the first superconductor pad, and a second conductive pad coupled to the second superconductor pad, wherein hot electrons are removed from the first normal metal pad when a bias voltage is applied between the first conductive pad and the second conductive pad.

In another example, a method of fabricating a solid state cooler device is disclosed. The method comprises forming a first normal metal pad on or in a first substrate or on or in a dielectric layer overlying the first substrate, forming an aluminum layer over the first normal metal pad, performing an oxidization process on the aluminum layer to form an aluminum oxide layer overlying the aluminum layer, and forming a superconductor layer over the aluminum oxide layer. The method further comprises forming a patterned mask over the superconductor layer, and performing an etch process to remove portions of the superconductor layer, the aluminum oxide layer and the aluminum layer based on the patterned mask to form a first normal metal-insulator-superconductor (NIS) junction that incudes the first normal metal pad, a first aluminum layer, a first aluminum oxide layer overlying the first aluminum layer, and a first superconductor pad overlying the first aluminum oxide layer, and a second NIS junction that includes the first normal metal pad, a second aluminum layer, a second aluminum oxide layer overlying the second aluminum layer, and a second superconductor pad overlying the second aluminum oxide layer, wherein the first and second NIS junctions are separated from one another by a gap.

DETAILED DESCRIPTION

The disclosure relates to a solid state cooler device that includes one or more NIS or a NISN junctions in which the insulator for the NIS or NISN device is formed from a thin aluminum oxide layer. The thin aluminum oxide layer is formed during an oxidized process of an aluminum layer. In one example, the aluminum layer functions as a normal metal. This can occur by selecting an aluminum layer that is thin enough to inversely proximitize when disposed on a normal metal layer. A normal metal is a metal that does not superconduct at cryogenic operational device temperatures. A refrigeration system can include a refrigeration container and a plurality of such solid state cooler devices disposed about the refrigeration container. The solid state cooler devices can form a last refrigeration stage in a plurality of refrigeration stages to provide cooling down to milliKelvin temperatures.

It is to be appreciated that the insulator in a NIS or NISN device facilitates controlled band gaps between the normal metal and superconductor material since the relative levels of bands can vary at the interface of the two materials. This insulator also hinders the return of heat back to the normal metal from the superconductor metal due to the hindering of the return of heat back to the cold normal metal. The utilization of a thin aluminum oxide layer formed by oxidation of aluminum layers provides for a controlled insulator thickness, which provides for an insulator with good operational performance characteristics that is readily formed, and also assure its function as an insulator.

Figure 1:
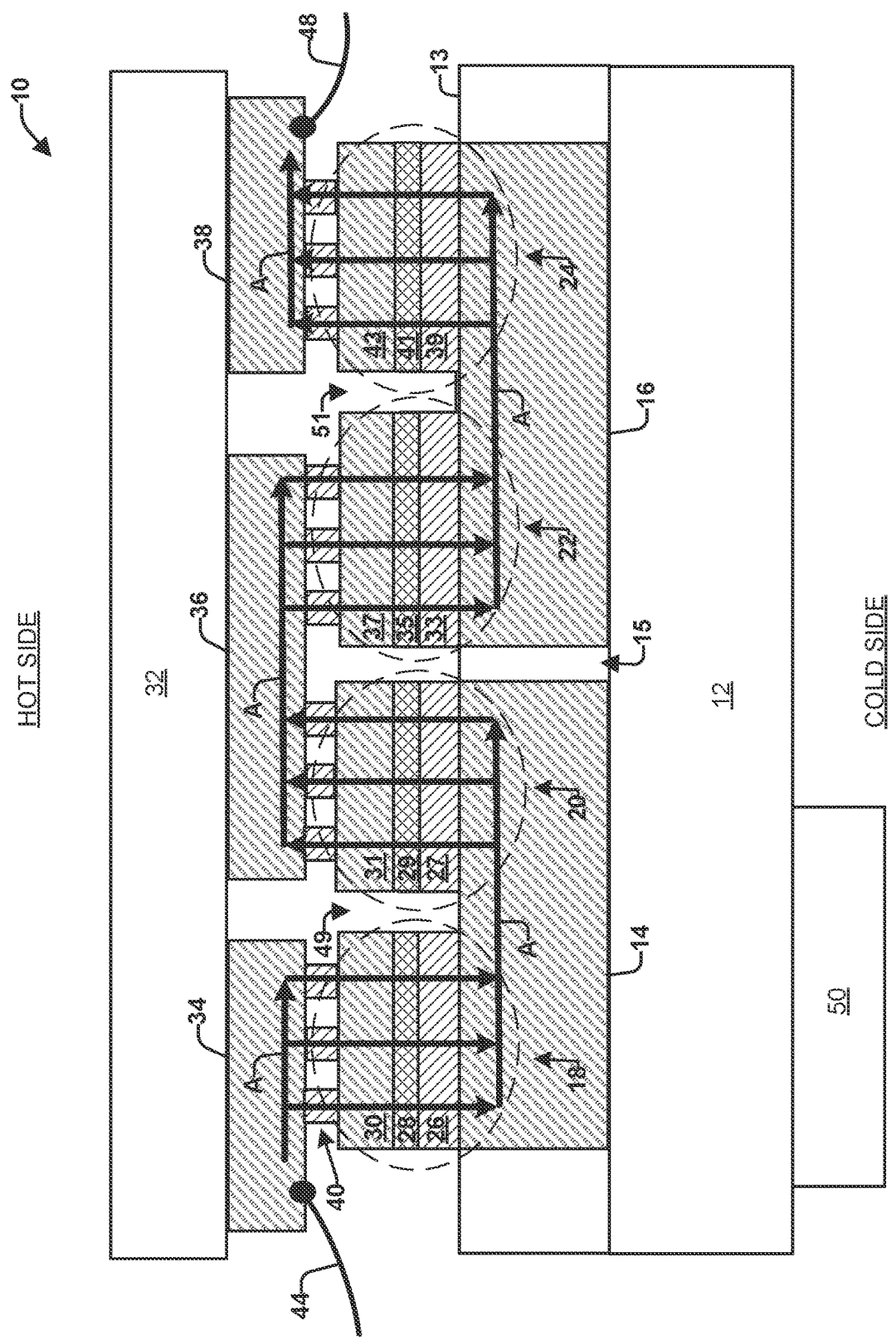
FIG. 1 illustrates a cross-sectional view of a solid state cooler device.

FIG. 1 illustrates a cross-sectional view of an example of a solid state cooler device 10 that employs one or more NIS or NISN devices. The solid state cooler device 10 can be configured as a refrigeration stage employed in a cryogenic cooling application in which the solid state structure is one of a plurality of solid state cooler devices disposed about a refrigeration container that resides in a vacuum and holds superconducting circuitry. The plurality of solid state structures can provide the final stage in a cryogenic refrigeration system, and allow for efficient cooling by removal of heat from a cold side of the refrigeration stage, and prevent the return of heat from the hot side of the last refrigeration stage within a plurality of refrigeration stages. The solid state cooler device includes one or more NIS junctions or NISN junctions with the insulator layers being formed from an aluminum oxide layer.

As illustrated in FIG. 1, the solid state cooler device 10 includes a first substrate 12 that is disposed on a cold side of a refrigeration stage, and a second substrate 32 that is disposed on a hot side of the refrigeration stage. The first substrate 12 can be a first chip containing superconducting circuitry and the second substrate 32 can be a second chip containing conventional or superconducting circuitry. Alternatively, the first and second substrates 12 and 32 can be a solid block of material such as a semiconductor or an insulator. A first normal metal pad 14 is disposed on a top side of the first substrate 12, and a second normal metal pad 16 is disposed on the top side of the second substrate 12 adjacent the first normal metal pad 14. The first normal metal pad 14 is spaced apart from the second normal metal pad 16 by a gap 15. The first normal metal pad 14 and the second normal metal pad 16 are disposed within a dielectric layer 13 but could be disposed above the dielectric layer 13, be disposed within the substrate 12 or be without the dielectric layer 13. The first normal metal pad 14 and the second normal metal pad 16 are formed of a normal metal, such as titanium tungsten alloy (TiW) or copper (Cu). An optional temperature sensor 50 resides on a bottom side of the first substrate 12 and can be formed of ruthenium oxide.

A first aluminum layer 26 is disposed on a first end of the first normal metal pad 14 and a second aluminum layer 27 is disposed on a second end of the first normal metal pad 14 separated from one another by a gap 49. A third aluminum layer 33 is disposed on a first end of the second normal metal pad 16 and a fourth aluminum layer 39 is disposed on a second end of the second normal metal pad 16 separated from one another by a gap 51. The first aluminum layer 26 includes a first aluminum oxide layer 28 capped with a first superconductor pad 30, the second aluminum layer 27 includes a second aluminum oxide layer 29 capped with a second superconductor pad 31, the third aluminum layer 33 includes a third aluminum oxide layer 35 capped with a third superconductor pad 37, and the fourth aluminum layer 39 includes a fourth aluminum oxide layer 41 capped with a fourth superconductor pad 43.

Each of the first, second, third and fourth aluminum layers 26, 27, 33 and 39 are selected to have a thickness (e.g., about 9 nanometers) that is thin enough to be inverse proximitized into behaving as a normal metal when disposed on a normal metal layer. Therefore, the first, second, third and fourth aluminum layers 26, 27, 33 and 39 work in cooperation with the first and second normal metal pads 14 and 16 to form the normal metal layer of respective NIS or NISN tunnel junctions. Additionally, the first, second, third and fourth aluminum oxide layers 28, 29, 35 and 41 are selected to have a thickness (e.g., about 9 Angstroms) thick enough to provide an insulator for a NIS or NISN tunnel junction. The first normal metal pad 14, the first aluminum layer 26, the first aluminum oxide layer 28, and the first superconductor pad 30 form a first NIS junction 18. The first normal metal pad 14, the second aluminum layer 27, the second aluminum oxide layer 29 and the second superconductor pad 31 form a second NIS junction 20. The second normal metal pad 16, the third aluminum layer 33, the third aluminum oxide layer 35 and the third superconductor pad 37 form a third NIS junction 22, and the second normal metal pad 16, the fourth aluminum layer 39, the fourth aluminum oxide layer 41 and the fourth superconductor pad 43 form a fourth NIS junction 24.

Each of the first, second, third and fourth NIS junctions 18, 20, 22 and 24 are coupled to the second substrate 32 through a plurality of conductive contacts 40 (e.g., normal metal such as gold) to a plurality of conductive pads (e.g., gold pads). Although the first, second, third and fourth NIS junctions 18, 20, 22 and 24 are illustrated as being above the first substrate 12, the first, second, third and fourth NIS junctions 18, 20, 22 and 24 or a portion thereof could be embedded within the first substrate 12. The plurality of conductive contacts 40 can be a plurality of bump bonds that function to both transport electrical current and heat along with functioning as a mechanical bond of the first substrate 12 to the second substrate 32.

A first conductive pad 34 is disposed on the second substrate 32 and is coupled to the first superconductor pad 30 via a first set of conductive contacts. The first conductive pad 34 can function as a quasi-particle trap for the first NIS junction 18 to form a first NISN junction. A second conductive pad 36 is disposed on the second substrate 32 and has a first end coupled to the second superconductor pad 31 via a second set of conductive contacts, and the second end of the second conductive pad 36 is coupled to the third superconductor pad 37 via a third set of conductive contacts. A third conductive pad 38 is disposed on the second substrate 32 and is coupled to the fourth superconductor pad 43 via a fourth set of conductive contacts. A first electrical wire 44 coupled to an end of the first conductive pad 34, and a second electrical wire 48 is coupled to an end of the third conductive pad 38. Although the first conductive pad 34, the second conductive pad 36, and the third conductive pad 38 are shown above the second substrate 32, in other examples, the first conductive pad 34, the second conductive pad 36, and the third conductive pad 38 can be disposed within the second substrate 32.

In operation, a bias voltage is applied between the first electrical wire 44 and the second electrical wire 48 causing a current to flow in the direction of Arrows labelled A. That is the current flows from the first electrical wire 44 through the first conductive pad 34, the first NISN junction 18, the second NISN junction 20, the second conductive pad 36, the third NISN junction 22, the fourth NISN junction 24, the third conductive pad 38 to the second electrical wire 48. The bias voltage raises the energy level of the hot electrons and the hot holes on the first normal metal pad 14 and the second normal metal pad 16, where hot electrons above the Fermi level tunnel and hot holes below the Fermi level tunnel across the insulatating layers into the superconductor pads to the conductive pads thus removing heat from the first and second normal metal pads 14 and 16. This provides for a reduction of temperature and an increase delta temperature between the hot side and cold side of the solid state cooler device 10. It is to be apreciated that cooling is provided by hot electrons and hot holes tunneling. The phenomena alternate along the current path, where one junction cooled by hot electron tunneling is followed by a second junction cooled by hot hole tunneling.

The normal metals in the device 10 can be formed of normal metals such as gold, platinum, or a metal that is above its superconducting transition temperature, such as titanium, titanium tungsten or chromium, or a combination thereof. The superconducting metals can be formed of a superconductor such as indium, niobium, aluminum, or some other superconducting metal. Although the example of FIG. 1 is shown as having 4 NIS or NISN devices, any multiple of 2 NIS or NISN devices will allow the solid state cooler to operate as described.

Turning now to FIGS. 2-13, fabrication is discussed in connection with formation of the solid state cooler of FIG. 1. Although the present example is illustrated as a first portion and second portion of the solid state cooler being fabricated serially, it is to be appreciate that both portions could be fabricated concurrently or in a reverse order with the second portion being fabricated first and the first portion being fabricated second.

Figure 2:
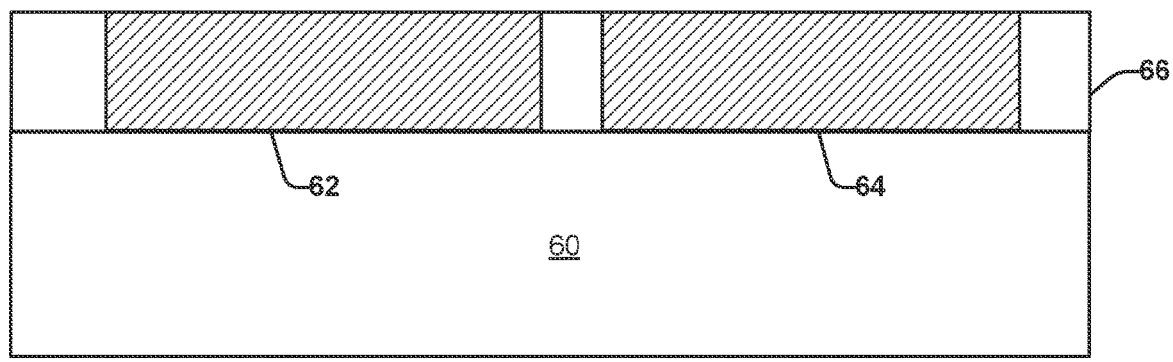
FIG. 2 illustrates a cross-sectional view of a first portion of a solid state cooler in its early stages of fabrication.

FIG. 2 illustrates a cross-sectional view of a first portion of a solid state cooler in its early stages of fabrication. A first normal metal pad 62 and a second normal metal pad 64 are disposed within a dielectric layer 66 (e.g., silicon oxide ($SiO_2$)) that collectively reside over a first substrate 60. The first normal metal pad 62 and the second normal metal pad 64 are formed of a normal metal, such as titanium tungsten alloy (TiW) or copper (Cu). The first normal metal pad 62 and the second normal metal pad 64 can be formed by the following: deposition of a dielectric 66 onto the substrate 60, a photolithography process of a normal metal layout in a patterned photoresist layer, etching of the normal metal layout into the dielectric layer 66 to form extended openings into the dielectric layer 66 and the stripping of the resist; deposition of normal metal such as chemical vapor deposition of tungsten (W) over a deposited physical vapor deposition titanium (Ti)/titanium nitride (TiN) liner; and a chemical mechanical polish (CMP) process on the normal metal to planarize the normal metal with the dielectric layer 66.

Figure 3:
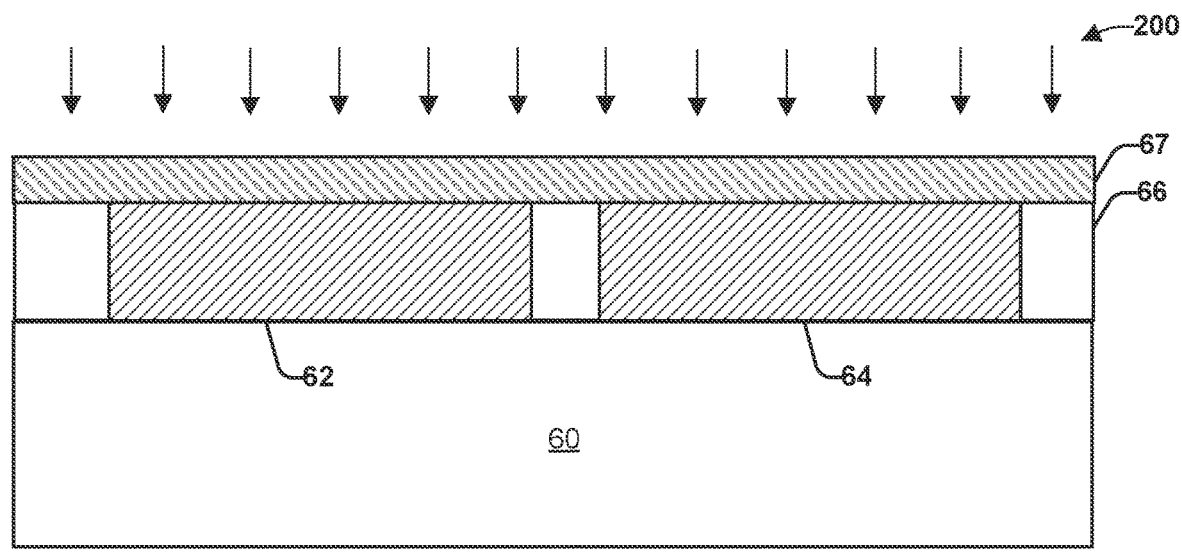
FIG. 3 illustrates a schematic cross-sectional view of the structure of FIG. 2 after undergoing a material deposition process, and while undergoing an oxidation process.
Figure 4:
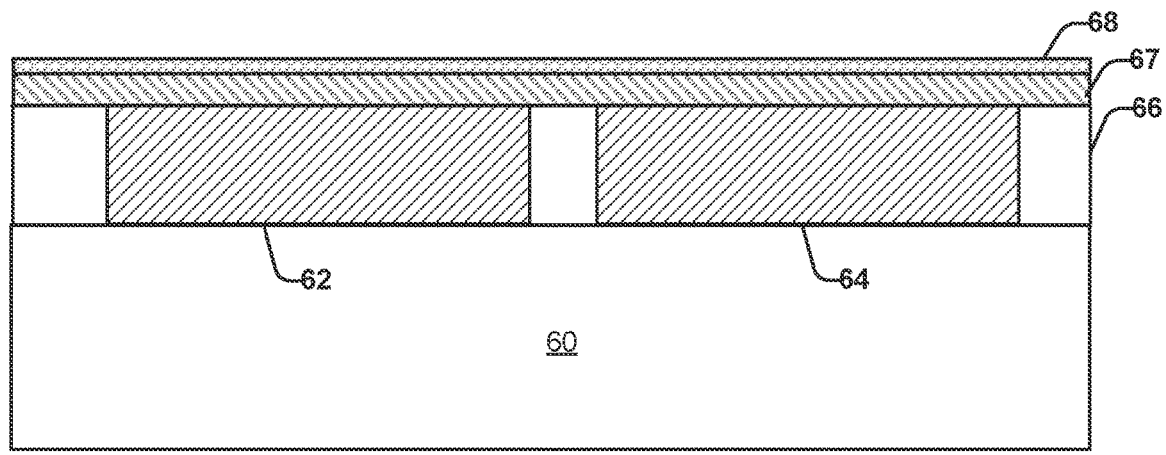
FIG. 4 illustrates a schematic cross-sectional view of the structure of FIG. 3 after undergoing the oxidation process.

Next, the structure undergoes a material deposition to form an aluminum layer 67 over the structure of FIG. 2 to provide the resultant structure of FIG. 3. The aluminum can be deposited employing a standard contact material deposition. Following deposition of the aluminum, the top surface of the aluminum layer 67 is oxidized via an oxidization process 200, as illustrated in FIG. 3. After the oxidization process 200, a thin layer of aluminum oxide (e.g., 9 Angstroms) is formed over the aluminum layer 67 to form an aluminum oxide layer 68, as shown in the resultant structure of FIG. 4. A superconductor material layer 69 (e.g., niobium) is then deposited over the aluminum oxide layer 68 to provide the resultant structure of FIG. 5. The superconductor material layer 69 can be deposited employing a standard contact material deposition.

Figure 5:
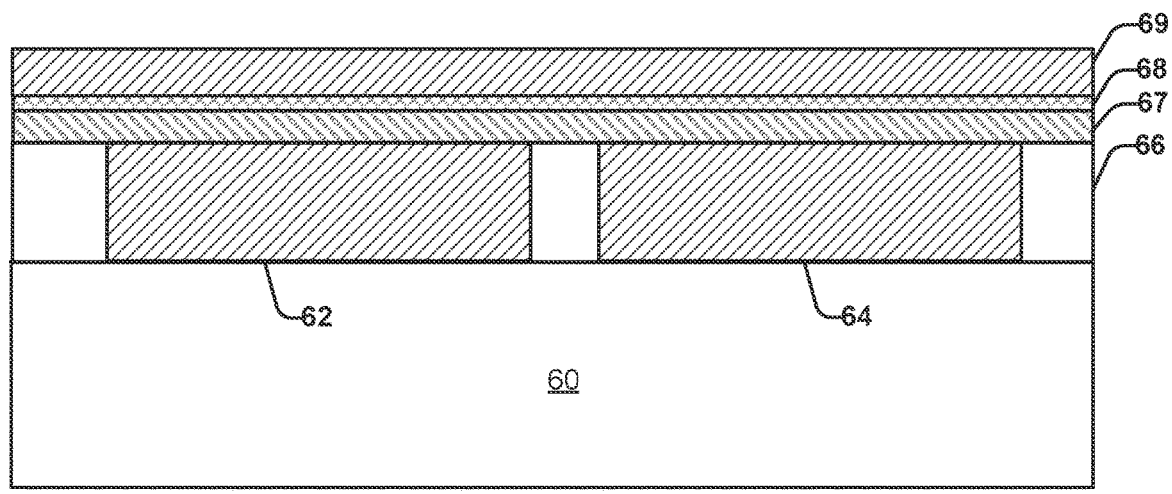
FIG. 5 illustrates a schematic cross-sectional view of the structure of FIG. 4 after a superconductor deposition process.
Figure 6:
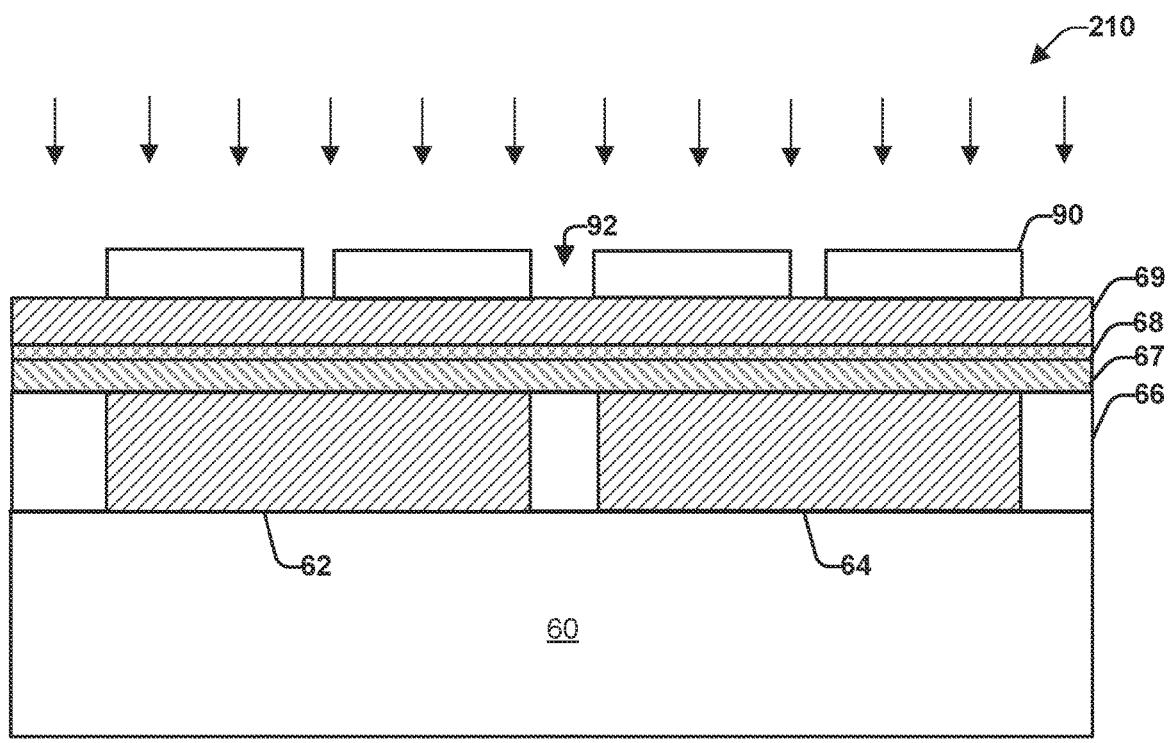
FIG. 6 illustrates a schematic cross-sectional view of the structure of FIG. 6 after a photoresist deposition and patterning and while undergoing an etching process.
Figure 7:
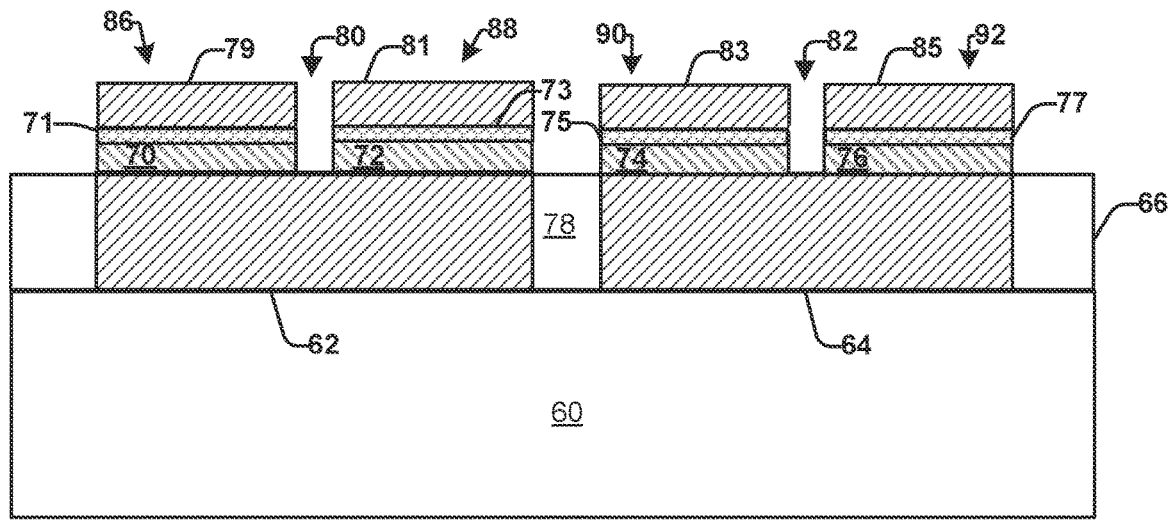
FIG. 7 illustrates a schematic cross-sectional view of the structure of FIG. 6 after the etching process and after the photoresist material layer has been stripped.
Figure 8:
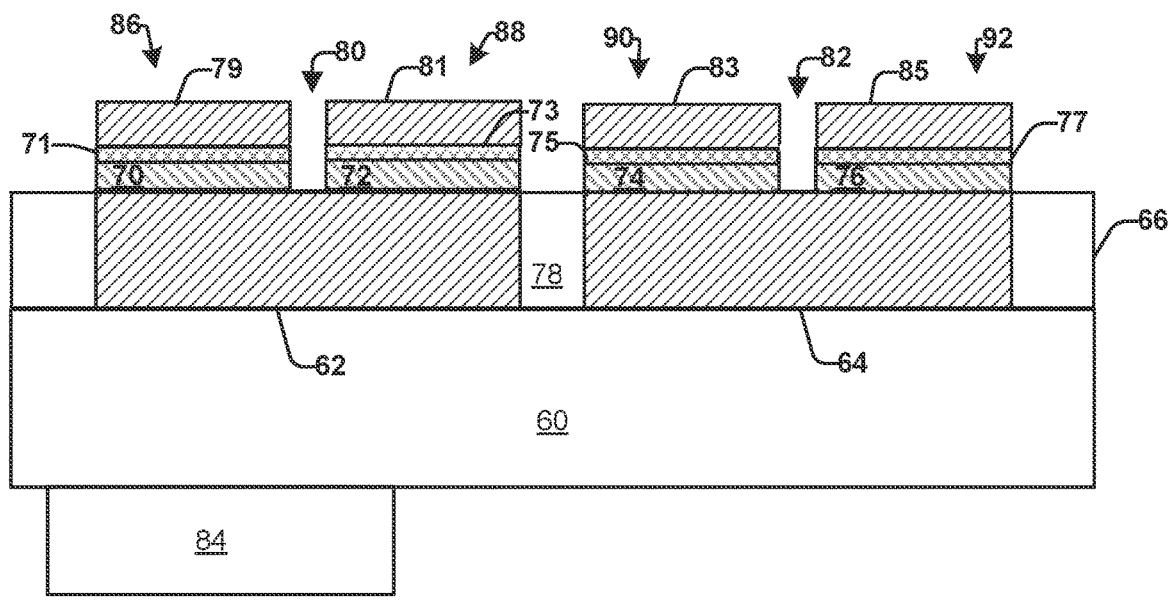
FIG. 8 illustrates a schematic cross-sectional view of the structure of FIG. 7 after a backside thinning process and after formation of a temperature sensor.

Next, a photoresist material layer 90 is formed over the structure of FIG. 5, and patterned with openings 92 over the superconductor material layer 69 to provide the structure of FIG. 6. An etch process 210 is then performed on the structure of FIG. 6 to extend the patterned openings 92 to the dieletric layer 66, the first normal metal pad 62 and the second normal metal pad 64. The photoresist material layer 90 is then removed to provide the resultant structure of FIG. 7 that includes a first NIS junction 86, a second NIS junction 88, a third NIS junction 90, and a fourth NIS junction 92.

The first NIS junction 86 is formed of the first normal metal pad 62, a first aluminum layer 70, a first aluminum oxide layer 71, and a first superconductor pad 79. The second NIS junction 88 is formed of the first normal metal pad 62, a second aluminum layer 72, a second aluminum oxide layer 73 and a second superconductor pad 81. The third NIS junction 90 is formed of the second normal metal pad 64, a third aluminum layer 74, a third aluminum oxide layer 75 and a third superconductor pad 83, and the fourth NIS junction 92 is formed of the second normal metal pad 64, a fourth aluminum layer 76, a fourth aluminum oxide layer 77 and a fourth superconductor pad 85.

The first, second, third and fourth aluminum layers 70, 72, 74 and 76 are selected to have a thickness (e.g., about 9 micrometers) thin enough to inverse proximitize with the normal metal layers 62 and 64. The first, second, third and fourth aluminum layers 70, 72, 74 and 76 work in cooperation with the first and second conductive pads 62 and 64 to form the normal metal layer of respective NIS or NISN tunnel junctions. The first, second, third and fourth aluminum oxide layers 71, 73, 75 and 77 are selected to have a thickness (e.g., about 9 Angstroms) thick enough to provide an insulator for a NIS or NISN tunnel junction.

Next, the backside of the first substrate 60 is thinned down by grinding or a chemical mechanical polish. An optional temperature sensor 84 can be formed on the backside of the first substrate 60 by depositing a layer of ruthenium oxide, which is then covered by a patterned photoresist material, and etched to provide the resultant temperature sensor 84 that resides on a bottom side of the first substrate 60, as illustrate in FIG. 8.

Figure 9:
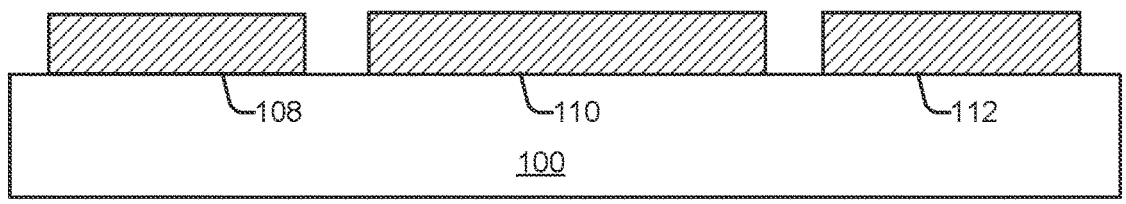
FIG. 9 illustrates a cross-sectional view of a second portion of a solid state cooler in its early stages of fabrication.

FIG. 9 illustrates a second portion of a solid state cooler in its early stages of fabrication. A first conductive pad 108, a second conductive pad 110 and a third conductive pad 112 are disposed on a second substrate 100. The first conductive pad 108, the second conductive pad 110 and the third conductive pad 112 can be formed by depositing and patterning a photoresist material, performing a metal evaporation process to deposit a normal metal (e.g., gold) and/or superconductor metal, and then performing a photoresist liftoff process (e.g., employing tape or solvent) to remove the photoresist and excess metal leaving the remaining metal in the form of the first conductive pad 108, the second conductive pad 110 and the third conductive pad 112, as illustrated in the structure of FIG. 9.

Figure 10:
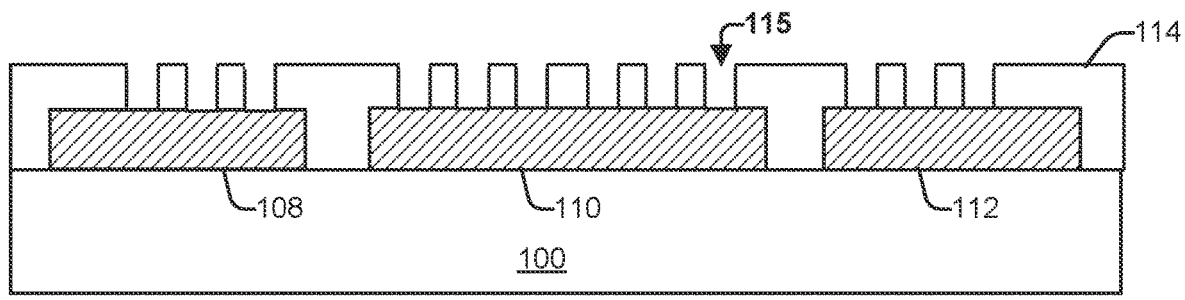
FIG. 10 illustrates a schematic cross-sectional view of the structure of FIG. 9 after deposition and patterning of a photoresist material layer.
Figure 11:
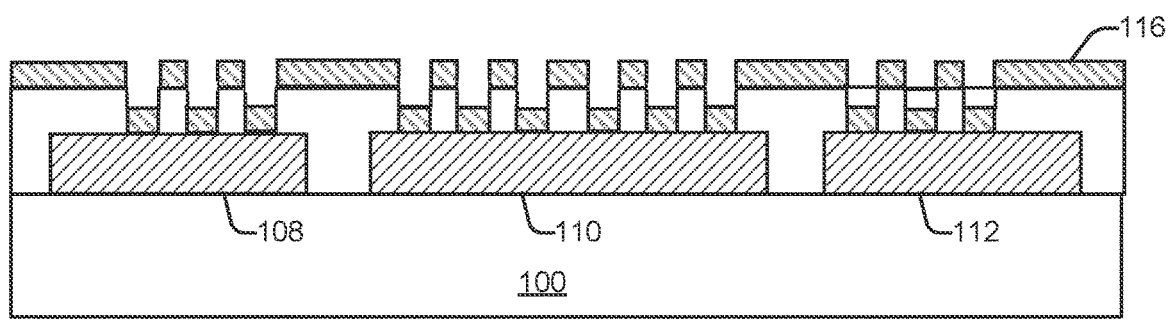
FIG. 11 illustrates a schematic cross-sectional view of the structure of FIG. 10 after a conductive material deposition process.
Figure 12:
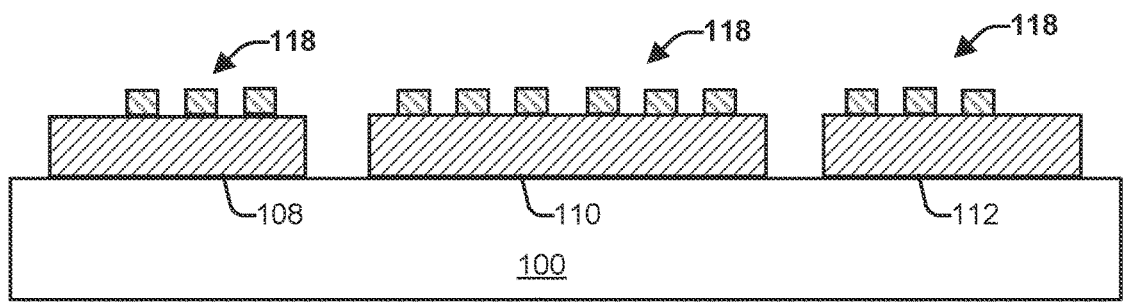
FIG. 12 illustrates a schematic cross-sectional view of the structure of FIG. 11 after liftoff of the photoresist material and excess conductive material.

Next, a photoresist material layer 114 is deposited and patterned with openings 115 over the structure of FIG. 9 to provide a bump layout (e.g., image reversal resist), as illustrated in FIG. 10. Next, an evaporation process is performed to evaporate a metal (e.g., gold) over the structure of FIG. 10 to provide the resultant structure of FIG. 11. Again, a liftoff process (e.g., tape, or solvent) is performed to remove the photoresist material layer 116 and excess metal to provide a plurality of conductive contacts 118 (e.g., bump bonds) formed on the surface of the first conductive pad 108, the second conductive pad 110 and the third conductive pad 112, as illustrated in FIG. 12. The conductive contacts 118 can be either fabricated from a superconducting metal and/or a normal metal. The conductive contacts 118 can be formed through etching and deposition, as opposed to using a standard liftoff process as illustrated in FIGS. 10-12. The conductive contacts can be formed on either the conductive pads as shown or on the superconductor pads.

Figure 13:
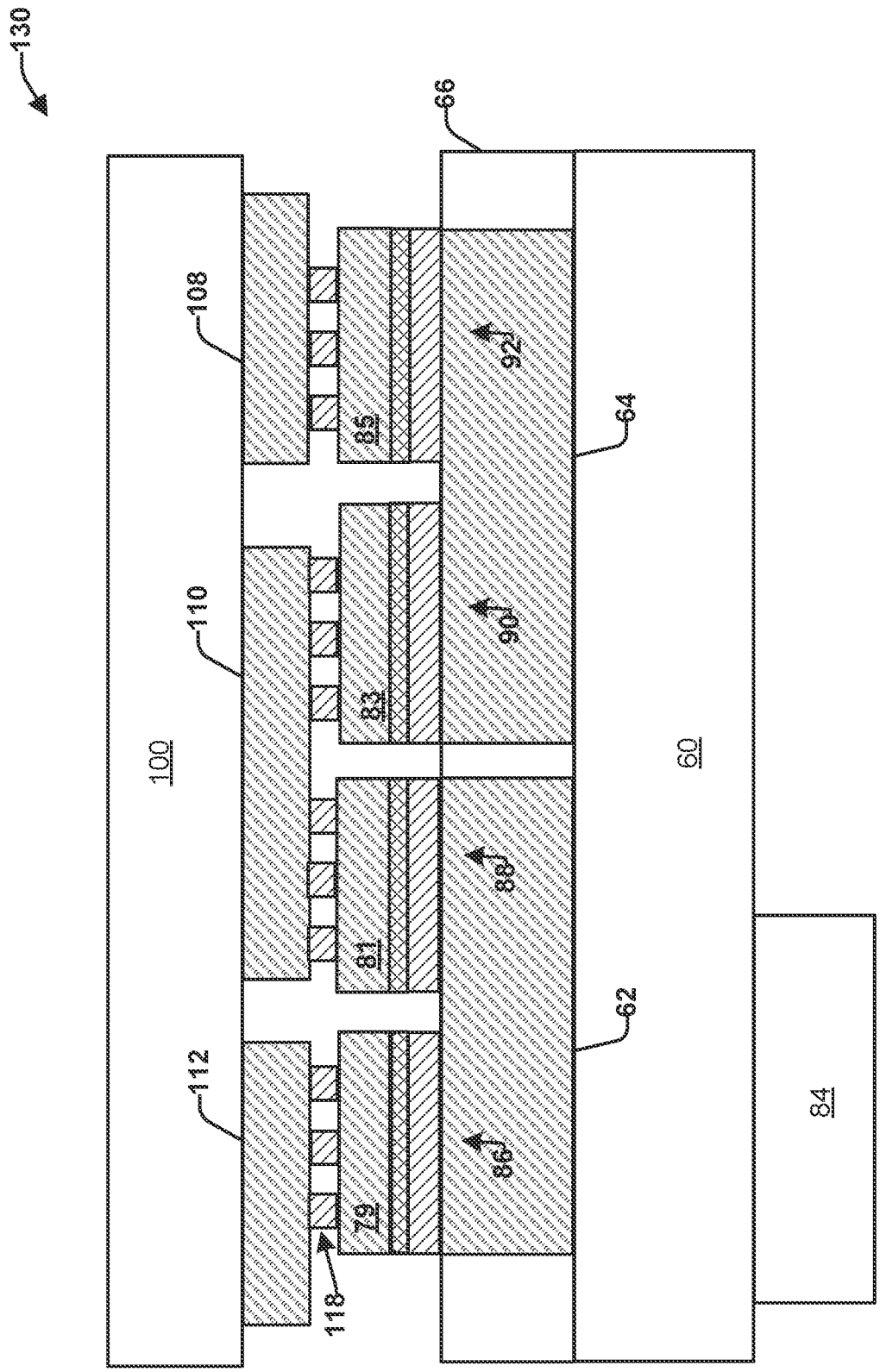
FIG. 13 illustrates formation of a solid state cooler by flipping and bonding the second portion of the cooler of FIG. 12 onto the first portion of the cooler of FIG. 8.

The second substrate 100 is then flipped and disposed over the first substrate 60 and bonded, such that the third conductive pad 112 is aligned and coupled to the first superconductor pad 79, a first end of the second conductive pad 110 is aligned and coupled to the second superconductor pad 81, a second end of the second conductive pad 110 is aligned and coupled to the third superconductor pad 83, and the first conductive pad 108 is aligned and coupled to the fourth superconductor pad 85. The resultant structure is illustrated in FIG. 13.

Figure 14:
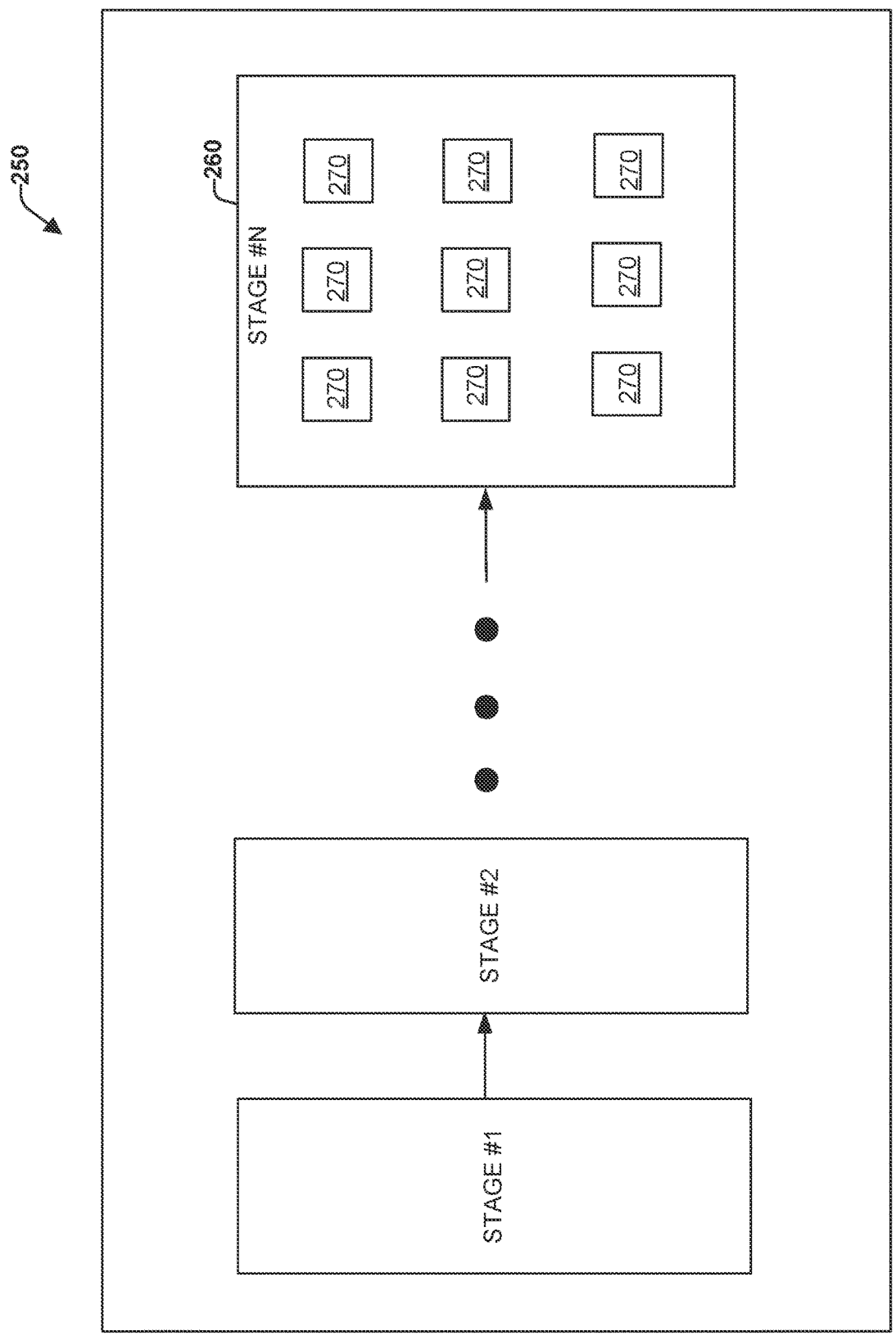
FIG. 14 illustrates a block diagram of a refrigeration system that employs solid state devices such as the solid state device of FIG. 1

FIG. 14 illustrates a block diagram of a refrigeration system 250 that employs solid state devices such as the solid state device 10 of FIG. 1. The refrigeration system 250 includes a plurality of stages labeled stage #1 to stage #N, where N is an integer greater than or equal to 2. Each refrigeration stage provides an additional temperature drop from the previous stage, such that the Nth stage is the final stage and provides the last temperature drop and lowest temperature of the refrigeration system 250. In other examples, the Nth stage is a first or intermediary stage as opposed to the last stage. Stage #N in the refrigeration system 250 includes a refrigeration container 260 with a plurality of solid state devices 270 similar to that illustrated in FIG. 1 disposed about the container and cooperating to provide the final lowest temperature of the refrigeration system 250 within the container 260. The container 260 can be in a vacuum environment and be configured to house superconducting circuitry. In another example, one or more of the other stages employ solid state devices similar to those in stage #N to provide incremental temperature drops across the refrigeration system 250. In other examples, the refrigeration container 260 can be formed of a normal metal that provides the final normal metal layer of each solid state device 270.

For purposes of simplification of explanation the terms "overlay", "overlaying", "overlying", "underlay" and "underlying" (and derivatives) are employed throughout this disclosure to denote a relative position of two adjacent surfaces in a selected orientation. Additionally, the terms "top" and "bottom" employed throughout this disclosure denote opposing surfaces in the selected orientation. Similarly, the terms "upper" and "lower" denote relative positions in the selected orientation are for purposes of illustration. In fact, the examples used throughout this disclosure denote one selected orientation. In the described examples, however, the selected orientation is arbitrary and other orientations are possible (e.g., upside down, rotated by 90 degrees, etc.) within the scope of the present disclosure.

Described above are examples of the subject disclosure. It is, of course, not possible to describe every conceivable combination of components or methodologies for purposes of describing the subject disclosure, but one of ordinary skill in the art may recognize that many further combinations and permutations of the subject disclosure are possible. Accordingly, the subject disclosure is intended to embrace all such alterations, modifications and variations that fall within the spirit and scope of the appended claims. In addition, where the disclosure or claims recite "a," "an," "a first," or "another" element, or the equivalent thereof, it should be interpreted to include one or more than one such element, neither requiring nor excluding two or more such elements. Furthermore, to the extent that the term "includes" is used in either the detailed description or the claims, such term is intended to be inclusive in a manner similar to the term "comprising" as "comprising" is interpreted when employed as a transitional word in a claim. Finally, the term "based on" is interpreted to mean at least based in part.

What is claimed is:

1. A method of fabricating a solid state cooler device, the method comprising:
    forming a first normal metal pad on or in a first substrate or on or in a dielectric layer overlying the first substrate;
    forming an aluminum layer over and directly attached to the first normal metal pad;
    performing an oxidization process on the aluminum layer to form an aluminum oxide layer overlying and directly attached to the aluminum layer;
    forming a superconductor layer over and directly attached to the aluminum oxide layer;
    forming a patterned mask over the superconductor layer;
    performing an etch process to remove portions of the superconductor layer, the aluminum oxide layer and the aluminum layer based on the patterned mask to form a first normal metal-insulator-superconductor (NIS) junction that incudes the first normal metal pad, a first aluminum layer, a first aluminum oxide layer overlying the first aluminum layer, and a first superconductor pad overlying the first aluminum oxide layer, and a second NIS junction that includes the first normal metal pad, a second aluminum layer, a second aluminum oxide layer overlying the second aluminum layer, and a second superconductor pad overlying the second aluminum oxide layer, wherein the first and second NIS junctions are separated from one another by a gap.

2. The method of claim 1, further comprising forming$$ a first conductive pad and a second conductive pad in or on a second substrate.

3. The method of claim 2, further comprising coupling the first conductive pad to the first superconductor pad, and coupling the second conductive pad to the second superconductor pad, wherein hot electrons are removed from the first normal metal pad when a bias voltage is applied between the first conductive pad and the second conductive pad.

4. The method of claim 3, further comprising:
    forming a first set of conductive contacts on one of the first superconductor pad and the first conductive pad;
    forming a second set of conductive contacts on one of the second superconductive pad and the second conductive pad;
    coupling the first superconductor pad to the first conductive pad via the first set of conductive contacts and coupling the second superconductor pad to the second conductive pad via the second set of conductive contacts.

5. The method of claim 4, wherein the first and second set of conductive contacts are bump bonds, such that the bump bonds bond the first substrate to the second substrate.

6. The method of claim 1, further comprising thinning a second side of the first substrate opposite the side of the normal metal pad, and fabricating a temperature sensor on the second side.

7. The method of claim 1, further comprising:
forming a second normal metal pad on or in the first substrate or on or in the dielectric layer overlying the first substrate;
wherein the forming an aluminum layer over and directly the first normal metal pad further comprises forming the aluminum layer over the second normal metal pad;
wherein performing an etch process to remove portions of the superconductor layer, the aluminum oxide layer and the aluminum layer based on the patterned mask also forms a third NIS junction that incudes the second normal metal pad, a third aluminum layer, a third aluminum oxide layer overlying the third aluminum layer, and a third superconductor pad overlying the third aluminum oxide layer, and a fourth NIS junction that includes the second normal metal pad, a fourth aluminum layer, a fourth aluminum oxide layer overlying the fourth aluminum layer, and a fourth superconductor pad overlying the fourth aluminum oxide layer, wherein the third NIS junction is separated from the second NIS junction by a second gap, and the third NIS junction is separated from the fourth NIS junction by a third gap;
coupling the second conductive pad to the third superconductor pad, wherein a first end of the second conductive pad is coupled to the second superconductor pad, and a second end of the second conductive pad is coupled to the third superconductor pad; and
coupling a third conductive pad to the fourth superconductor pad.

8. The method of claim 7, further comprising coupling a first wire to the first conductive pad, and coupling a second wire to the third conductive pad.

9. The method of claim 8, wherein hot electrons are removed from the first normal metal pad and the second normal metal pad when a bias voltage is applied between the first wire and the second wire.

* * * * *